United States Patent [19]

Smith

[11] Patent Number: 4,527,942

[45] Date of Patent: Jul. 9, 1985

[54] ELECTRONIC TEST HEAD POSITIONER FOR TEST SYSTEMS

[75] Inventor: Nathan R. Smith, Vincentown, N.J.

[73] Assignee: InTest Corporation, Cherry Hill, N.J.

[21] Appl. No.: 411,311

[22] Filed: Aug. 25, 1982

[51] Int. Cl.³ .............................................. B25J 1/12
[52] U.S. Cl. .................... 414/590; 324/158 F; 414/744 A; 414/673; 414/665; 414/639; 901/14; 901/48; 269/71
[58] Field of Search ............... 414/589, 719, 590, 911, 414/222–225, 718, 744 A, 591, 673, 665, 639; 324/158 F; 269/60, 61, 71; 901/14, 17, 48

[56] References Cited

U.S. PATENT DOCUMENTS

| | | | |
|---|---|---|---|
| 2,697,529 | 12/1954 | Hubbell et al. | 901/14 X |
| 3,262,593 | 7/1966 | Hainer | 414/751 X |
| 3,665,148 | 5/1972 | Yasenchak et al. | 901/48 X |
| 3,791,052 | 2/1974 | van der Lely | |
| 3,826,383 | 7/1974 | Richter | |
| 3,873,148 | 3/1975 | Kennicuit | |
| 3,884,365 | 5/1975 | Thomson | 901/14 X |
| 4,062,455 | 12/1977 | Flatau | |
| 4,076,131 | 2/1978 | Dahlstrom et al. | |
| 4,132,318 | 1/1979 | Wang et al. | |
| 4,188,166 | 2/1980 | Moreau et al. | |
| 4,199,294 | 4/1980 | Streck et al. | |
| 4,264,266 | 4/1981 | Trechsel | |
| 4,273,506 | 6/1981 | Thomson et al. | |
| 4,299,529 | 11/1981 | Inaba et al. | |
| 4,303,368 | 12/1981 | Dent et al. | |
| 4,317,560 | 3/1982 | Troyer | 901/14 X |
| 4,348,142 | 9/1982 | Figour | 901/17 X |

FOREIGN PATENT DOCUMENTS 3048045 7/1982 Fed. Rep. of Germany.
2074337 10/1981 United Kingdom.

OTHER PUBLICATIONS

Universal Manipulator #UM 4000 Brochures by Reid Ashman Manufacturing, Inc.
IBM 7535 Manufacturing System Brochure.
IBM 7540 Manufacturing System Brochure.
IBM 7565 Manufacturing System Brochure.

Primary Examiner—Terrance L. Siemens
Attorney, Agent, or Firm—Ratner & Prestia

[57] ABSTRACT

A system for positioning an electronic test head of a test system with respect to an electronic device handler. A housing is provided having a vertical shaft. A positioner assembly moves vertically with respect to the shaft and provides substantial movement in the horizontal plane with six degrees of freedom. The positioner assembly includes a section for attaching the test head. A counterbalancing assembly is coupled to the positioner assembly and has a counterweight to provide a substantially weightless condition to the positioner assembly with the test head attached.

11 Claims, 9 Drawing Figures

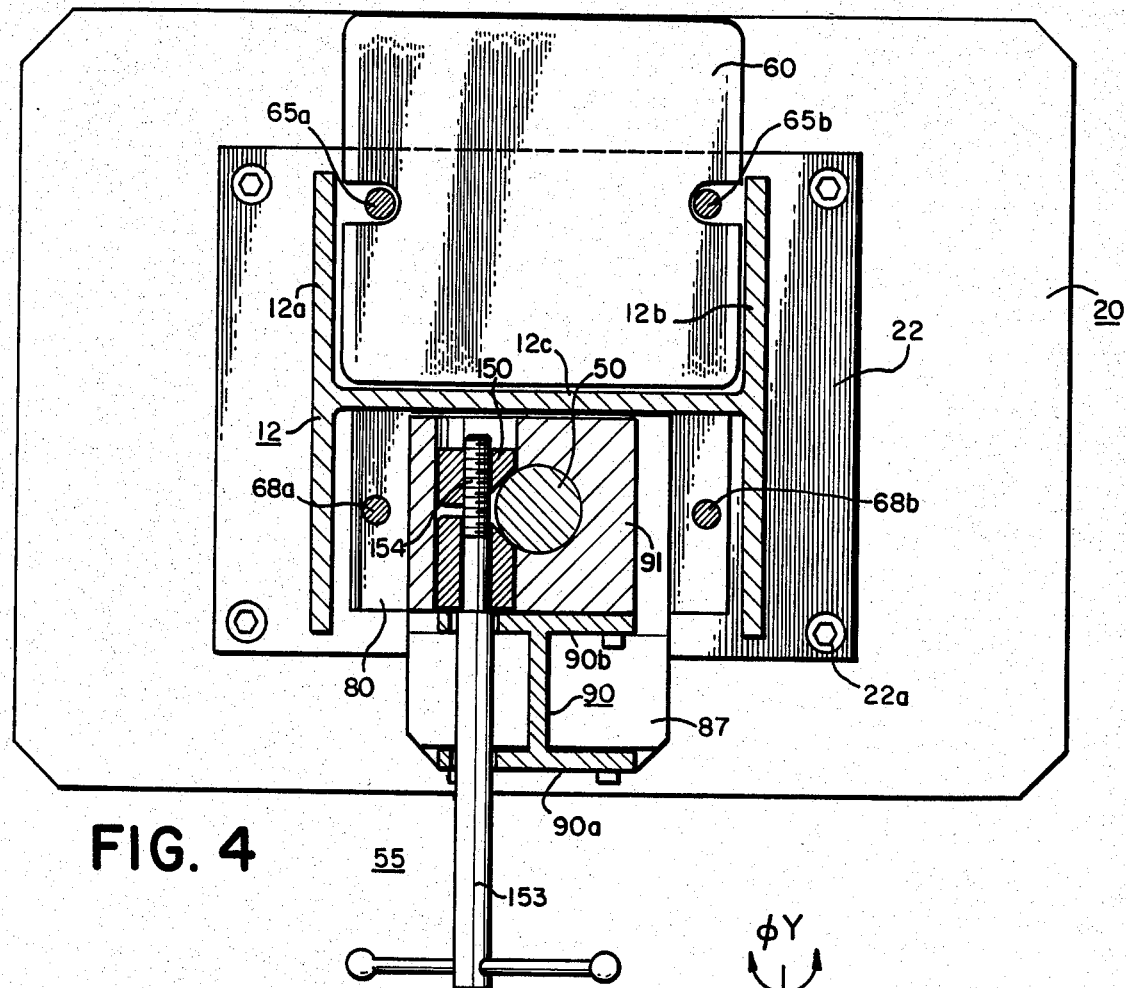
FIG. 4
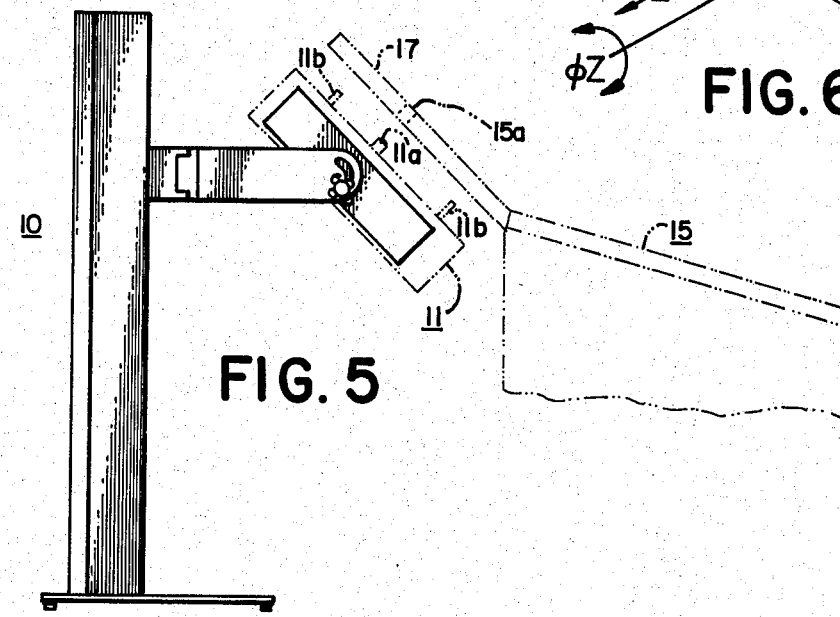
FIG. 5
FIG. 6

ELECTRONIC TEST HEAD POSITIONER FOR TEST SYSTEMS

BACKGROUND OF THE INVENTION

A. Field of the Invention

This invention relates to the field of art of electronic test head positioners.

B. Background Art

In the automatic testing of integrated circuits (IC) and other electronic devices, special device handlers have been used which place the device to be tested in position. The electronic testing itself is provided by a large and expensive automatic testing system which includes a test head which has been required to connect to and dock with the device handler. In such testing systems, the test head has been usually very heavy in the order of 100 to 150 pounds. The reason for this heaviness is that the test head uses high speed electronic timing signals so that the electronic circuits must be located as close as possible to the device under test. Accordingly, the test head has been densely packaged with electronic circuits in order to achieve the high speed testing of the sophisticated devices.

The prior art has left much to be desired in providing a manipulator or positioner to easily move the heavy test head accurately into position with respect to the device handler mechanism. In some prior positioners the test head has been positioned by means of lead screws and rotating and sliding mechanisms each movable one at a time. These prior systems left much to be desired in that they did not provide all of the degrees of freedom necessary for easy and accurate docking with the handler. The user has had to move the heavy device handler or the heavy positioner itself in order to provide alignment. Other prior art manipulating systems have used motors to drive the lead screws in the up/down direction. Such a motor driven lead screw or even a hand driven one provides the possibility of damaging either the test head socket connections or the connections which are on the device handler due to overstressing.

Another disadvantage of the prior art systems is that they are large and take up a considerable amount of floor space which is at a premium in test facilities. A further difficulty of large prior systems has involved the cable which connects the test system to the test head which is usually short, cumbersome and fragile. Accordingly as a result of their size and construction, prior systems could not be moved sufficiently close to the test system.

Accordingly, an object of the present invention is an electronic test head positioner that has six degrees of freedom and provides a substantially weightless condition to the test head which may be manipulated by hand for easy and accurate docking and undocking of the test head with the device handler.

Another object of the invention is an electronic test head positioner formed by a column rising vertically from a base which takes little room on the floor with respect to the test system.

SUMMARY OF THE INVENTION

A system for positioning an electronic test head with respect to an electronic device handler which comprises a housing including shaft means. A positioner assembly has vertical movement along the shaft means and provides substantial movement in the horizontal plane with six degrees of freedom. The positioner assembly includes means for attaching the test head. Counter-balancing means is coupled to the positioner and includes a counterweight to provide a substantially weightless condition to the positioner assembly with the test head attached.

BRIEF DESCRIPTION OF THE DRAWINGS

FIG. 4 is a sectional view of FIG. 3;

FIG. 5 is a diagrammatic view of the system of FIGS. 1-3 showing the docking of a test head with a mechanism plate of a handler;

FIG. 6 diagrammatically shows the six degrees of freedom of the system of FIGS. 1-3.

DESCRIPTION OF THE PREFERRED EMBODIMENT

Figure 1:
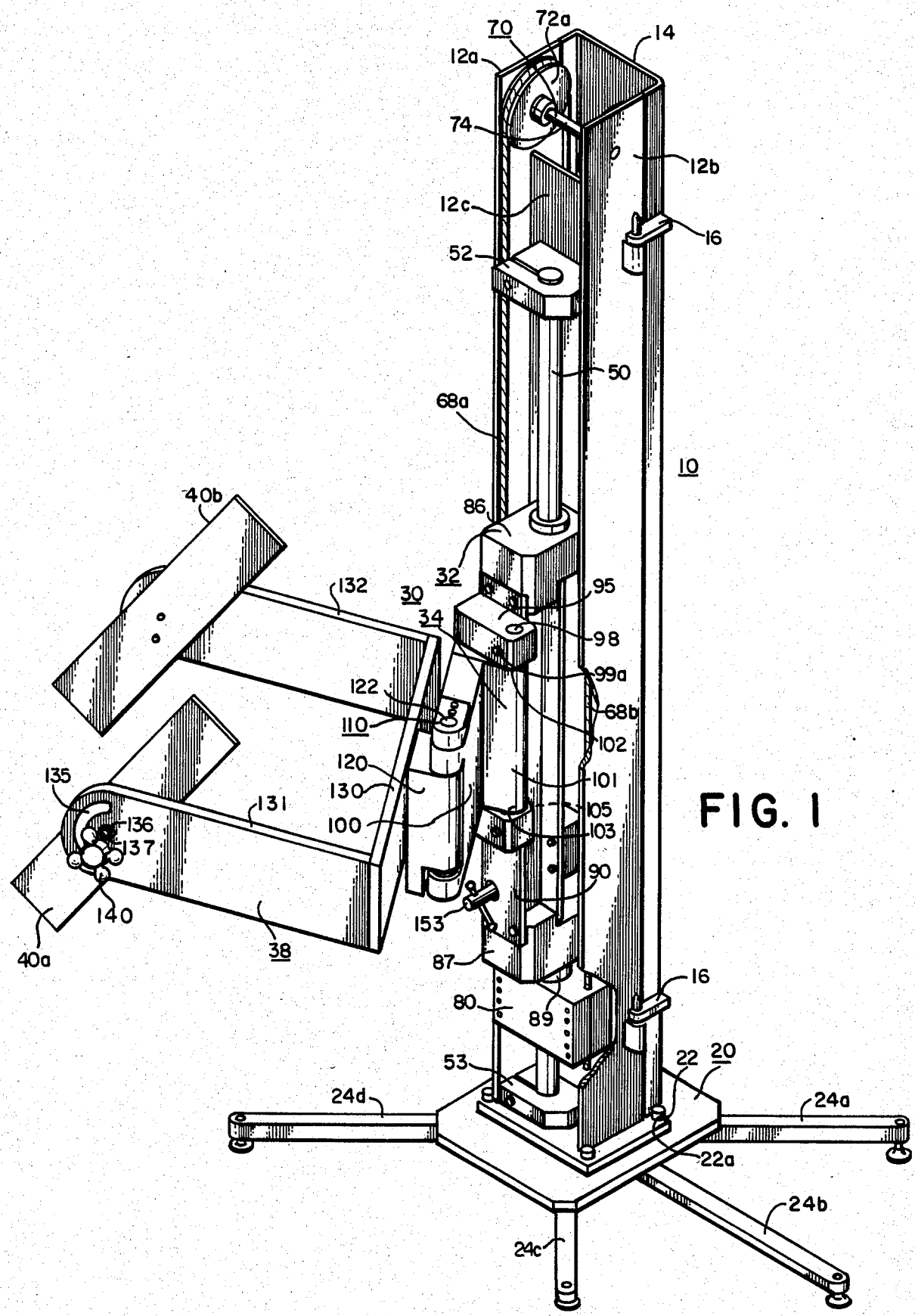
FIGS. 1-3 are perspective view of a test head positioner system in accordance with the present invention.

Referring now to FIG. 5, there is shown a test head positioner system 10 in accordance with the invention. As shown, positioner system 10 carries a test head 11 for a test system for docking with a mechanism plate 17 of an integrated circuit handler 15. It will be understood that other electronic devices may be handled by device handler such as transistors, chips or dies, etc. In operation, positioner system 10 is moved manually in a substantially weightless condition to manipulate the heavy test head 11 accurately and precisely and dock it into the mechanism plate 17. In docking, location pins 11b are inserted into corresponding openings in plate 17 and test connector 11a enters and mates with the device 15a to be tested. As will later be described in detail, the position of test head 11 may be accurately manipulated in a substantially weightless condition to another position with six degrees of freedom to dock with other mechanism plates in any position. For example, mechanism plates for probers or handlers may be anywhere from a horizontal plane to a vertical plane.

Figure 2:
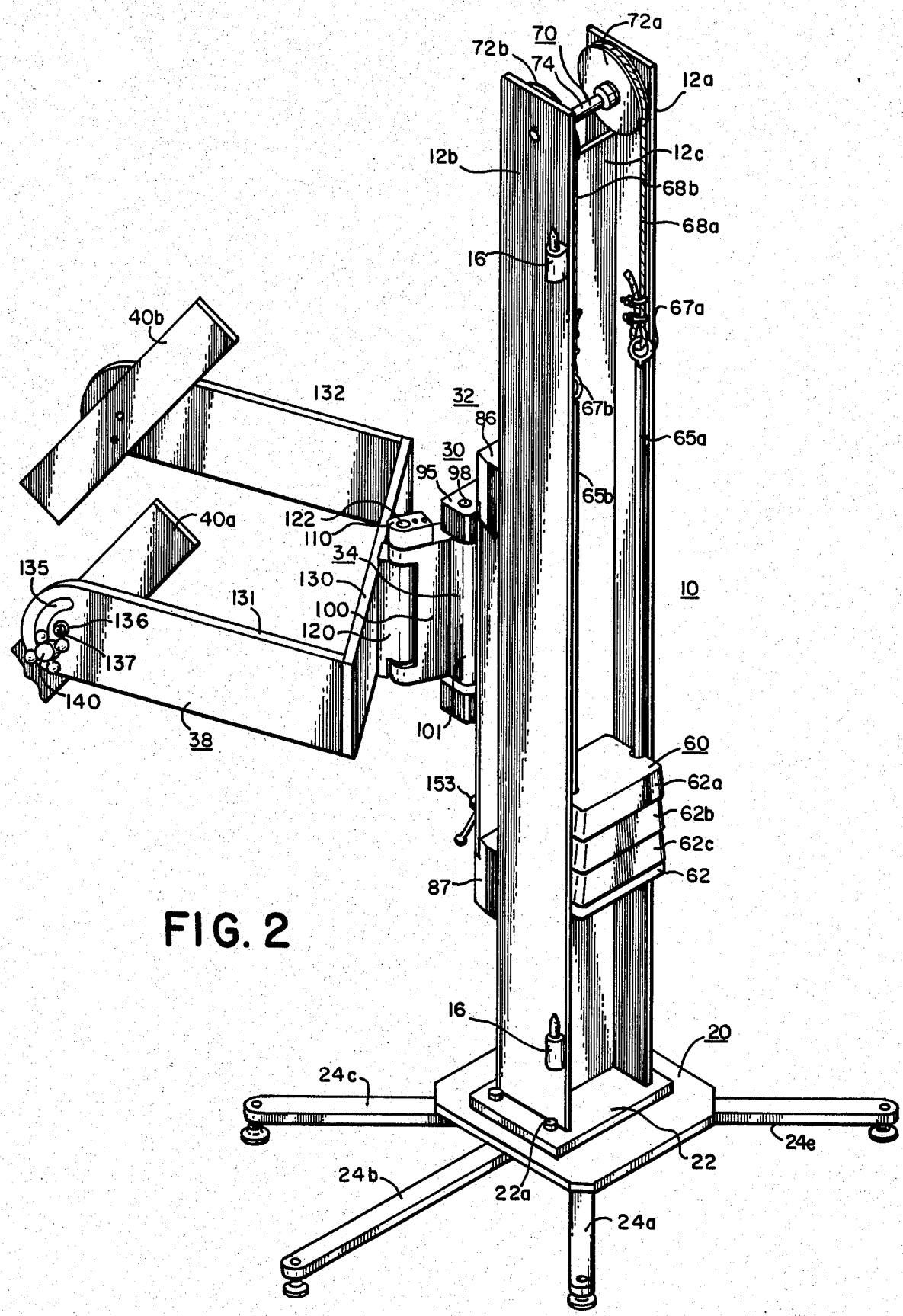
Figure 3:
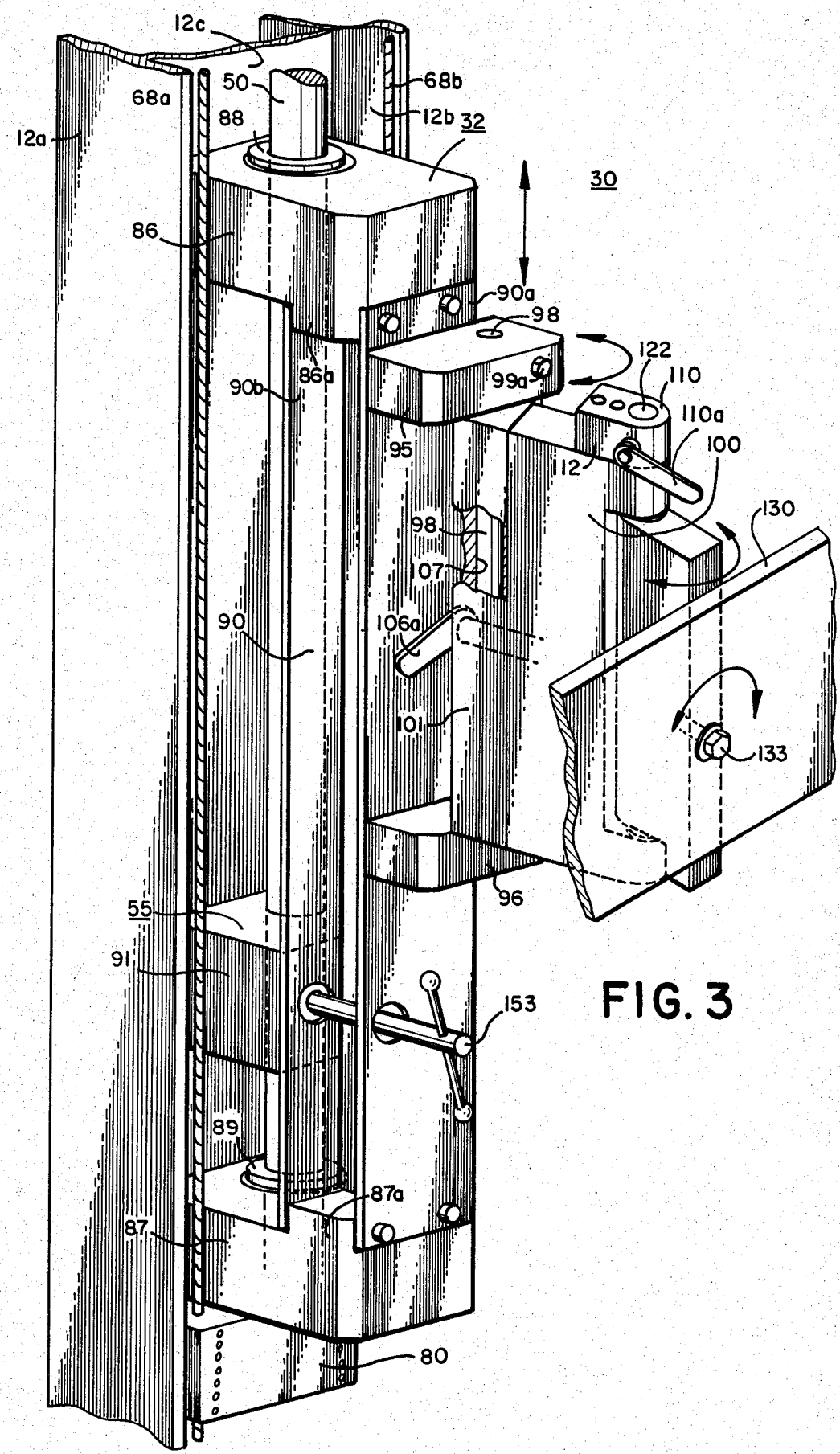

The details of positioner system 10 are shown in FIGS. 1-3 in which there is provided an H-shaped beam forming a vertical housing or column 12. Column 12 has opposing walls 12a,b with a flange or webb 12c connecting the two walls together. Column 12 is supported at its bottom by a base assembly 20 having a base plate 22 and outwardly extending legs 24a-e which are bolted to the bottom of plate 22, for example. Column 12 is secured to plate 22 by bolts 22a for example. The rear of column 12 is closed by a U-shaped door 14 which is hinged to the outer surface of wall 12b by way of hinges 16.

Test head 11, FIG. 5, is supported and manipulated in its docking by a positioner arm assembly 30 which is adapted to move vertically on a main shaft 50. Assembly 30 comprises a main arm assembly 32, a forearm assembly 34, a wrist joint assembly 36, a cradle assembly 38 and test head adapter plates 40a,b. Main shaft 50 is secured in place on the front section of column 12 by opposing pillow blocks 52,53.

Positioner arm assembly 30 is adapted to ride vertically on main shaft 50 by a counter weight assembly 60 having a weight carriage 62 which moves vertically in either direction within the rear section of column 12. Carriage 62 has vertically extending shafts 65a,b secured thereto and weights 62a–c are removably received and carried by the carriage. Weights 62a–c are added to exactly counterbalance the weight of assembly 30 together with the test head so that the test head and assembly 30 are substantially weightless.

The upper ends of carriage shafts 65a,b are formed into eye bolts 65a,b to securely receive flexible cables 68a,b respectively. In another embodiment (not shown) shafts 65a,b may be threaded to receive threaded members swaged to receive the cable ends. Cables 68a,b are received within grooves of pulleys 72a,b respectively of pulley assembly 70. Assembly 70 has a shaft 74 which permits the rotation of pulleys 72a,b and is received at an upper end section of column 12 in openings in walls 12a,b respectively. Cables 68a,b then extend downwardly along the inner surface of walls 12a,b and are securely fastened to a lift block 80 which is positioned under main arm assembly 32 and has an opening for receiving shaft 50. Block 80 slides along web 12c and is thus prevented from rotating around shaft 50. A thrust bearing 89 is provided between block 80 and a lower bearing block 87 of arm assembly 32 to permit assembly 32 to rotate to a limited extent about shaft 50 while block 80 is unable to so rotate.

Referring now to FIG. 3, there is shown the details of positioner arm assembly 30. Specifically, main arm assembly 32 includes an upper bearing block 86 and a lower bearing block 87. Bearing blocks 86, 87 have respective lower extending and upper extending sections 86a, 87a and as shown engage an I beam 90. Specifically, a front wall 90a of I beam 90 is secured by screws to front faces of blocks 86, 87 while a rear section 90b of I beam 90 is secured by screws to sections 86a, 87a respectively. In this way a unitary main arm assembly 32 is formed which is adapted to have vertical movement and rotational movement (about a vertical axis) on a vertical shaft 50 by means of combination bearing set 88 for block 86 and combination bearing set 89 for bearing 87. Combination bearing sets are well known in the art and are made for example by Thompson Industries. The vertical and rotational movements of assembly 32 may be temporarily locked in any position by means of a main arm assembly lock 55 formed in block 91 and this lock will later be described in detail.

Secured to front face 90a of I beam 90 are a pair of pillow blocks 95, 96 of forearm assembly 34. A vertical shaft 98 extends through pillow blocks 95, 96 and is secured in place by a screw 99a. Forearm assembly 34 further includes a forearm 100 having a rear section 101 which is bolted to forearm 100 by means of bolts. Shaft 98 extends through vertical opening 107 in section 101 with needle bearings 102, 103 at either end of section 101 and a thrust bearing 105 between the lower portion of section 101 and the upper face of pillow block 96. Forearm assembly 34 may be temporarily fixed in its rotational position about a vertical axis by means of a forearm lock assembly 106.

Forearm 100 has front "C" shaped section which rotatively receives an attachment member 120 of wrist joint assembly 36. Member 120 rotates with respect to forearm 100 by way of a vertical shaft 122 which extends through a vertical opening in forearm 100, through member 120 and then into a lower opening in forearm 100. Needle bearings 124, 125 are provided for the rotation of shaft 122 in forearm 100 and a thrust bearing 128 is provided between the lower surface of member 120 and the upper surface of forearm 100. Shaft 122 is rigidly secured within member 120. Member 120 may be temporarily prevented from rotation by means of a wrist joint lock assembly 110 which is formed within a block 112 secured to the upper surface of forearm 100.

Cradle assembly 38 is formed by three walls 130–132 welded together to form a U-shaped holder for the test head. Assembly 38 is rotatable with respect to member 120 by means of a horizontal bolt 133 which extends through wall 130 and is threadedly received in member 120. For bearing surfaces, bolt 133 extends into a stainless steel bushing and between the back surface of wall 130 and member 120 there is provided a stainless steel plate (not shown). Bolt 133 and the bearing surfaces are effective to allow the rotation of assembly 38 about a horizontal axis and assembly 38 may be secured in position by tightening of the bolt.

Walls or arms 131, 132 are adapted to receive test head adapter plates 40a,b and to allow these plates to rotate with respect to the walls and then to be rigidly fixed in position. Since the structure of both of the plates 40a,b are the same only one of them need be described in detail. Accordingly, arm 131 has within an end section a circular groove 135 and an opening 136 for receiving a shoulder screw 137 which is threadedly engaged in plate 40a. A lock knob 140 is threaded into plate 40a and moves about circular groove 135 in conventional manner. In this way, by tightening lock knob 140, plate 40a is rigidly secured with respect to arm 131.

It will now be understood that test head positioner system 10 simultaneously positions in six degrees of freedom, X, Y, Z, $\theta_X$, $\theta_Y$, $\theta_Z$. As shown in FIG. 6, it is important for the proper docking of test head 11 that the test connector 11a have that six degrees of freedom so that it can accurately and effortlessly be positioned with respect to the device to be tested 15a, for example. If the Y direction were considered to be the vertical or up/down direction then the movement of assembly 32 vertically with respect to shaft 50 provides the Y direction of freedom. $\theta_Y$ freedom, which is the rotation about the Y axis is then provided by simultaneous rotation of all of the joints about vertical axes 50, 98 and 122.

If the X direction were considered to be the left to right direction, then that freedom is provided by pivots 50, 98 and 122 in the same manner as $\theta_Y$. The $\theta_X$ freedom is provided by shoulder screw pivot 137. With respect to Z movement which may be considered to be the in and out movement, such freedom is provided by pivot shafts 50, 98 and 122 in the same way as $\theta_Y$, $\theta_Z$ is then provided by the freedom about screw pivot 133.

Referring now to FIG. 4, there is shown a main arm assembly lock 55 which comprises the conventional wedge lock system. Specifically, two wedges 150 and 152 are provided on either side of shaft 50 and are threadedly engaged by threads 154 of a lock handle 153. By turning lock handle 153 clockwise, wedge members 150, 152 are brought together and apply pressure onto shaft 50 and this way prevent rotation of block 91 about shaft 50 and also prevent a vertical movement of block 91 and the entire assembly 30. Similar lock assemblies are provided for forearm lock assembly 106 and wrist joint lock assembly 110 which have turning arms 106a and 110a respectively.

It will now be understood that test head positioner system 10 provides a counterbalancing system which produces a weightless condition to the positioner arm assembly 30. In this manner, the test head 11 may be moved in this weightless condition substantially extensible in the horizontal plane and with six degrees of motion to provide the ease in docking.

Those skilled in the art will understand that various changes may be made in further embodiments of the invention without departing from the spirit or scope of the invention.

Figure 7A:
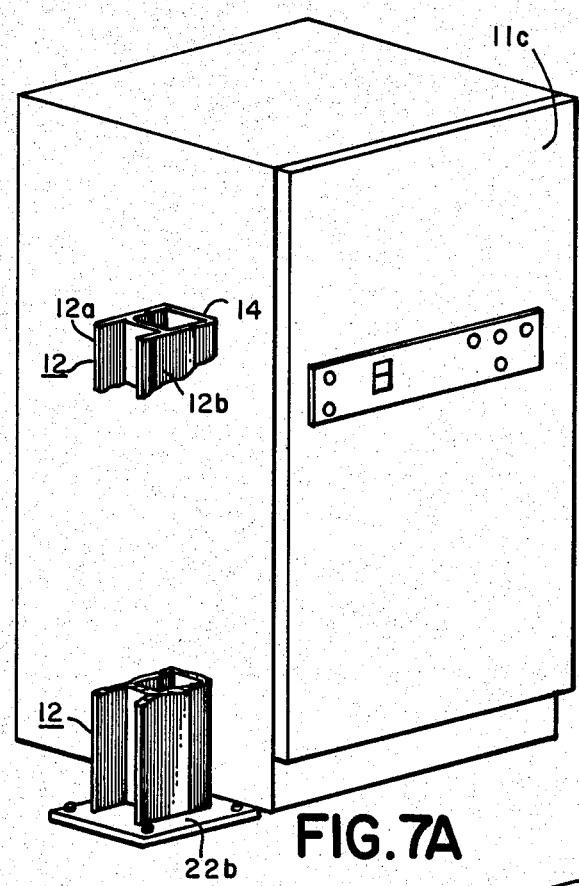
FIGS. 7A-C show further embodiments of the invention with respect to securing the positioner system alongside the test system.
Figure 7B:
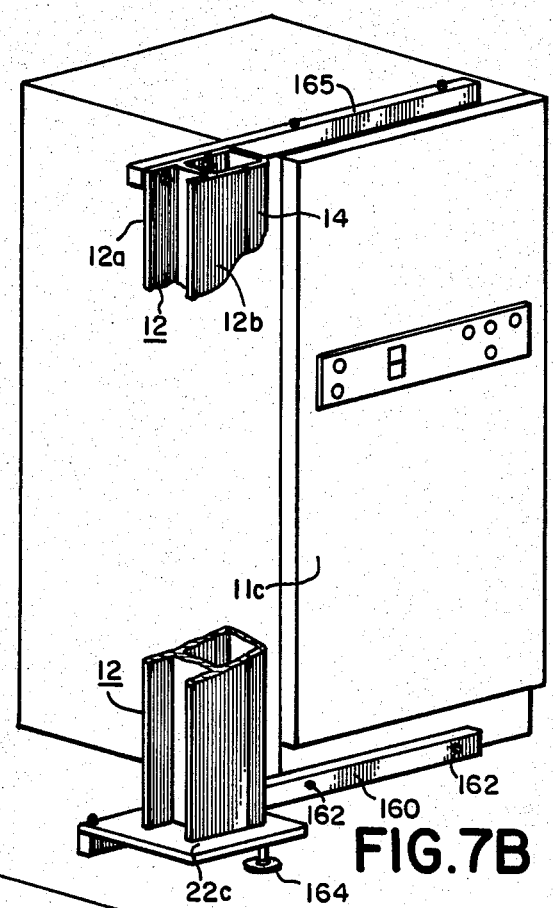
Figure 7C:
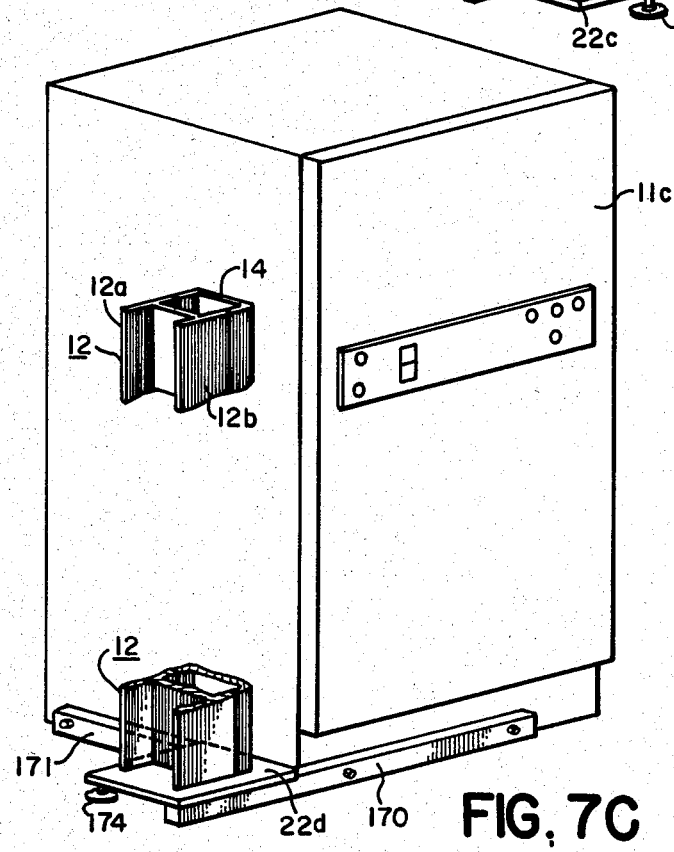

Referring to FIG. 7A there is shown base plate 22 which is directly bolted onto the floor immediately next to test cabinet 11c of the test system. For purposes of simplicity the elements within column 12 have not been shown. In still another embodiment shown in FIG. 7B a base 22C has attached to its lower surface along one side a rigid horizontal bar or leg 160. Mounting bolts 162 are used to secure bar 160 to the bottom of cabinet 11c. A leveling pad 164 remote from bar 160 on base 22a provides leveling of the base. A further bar or strut 165 is secured by bolts to the top of cabinet 11c and to wall 12a of column 12. In this manner, column 12 is rigidly secured close to test cabinet 11c so that system 10 is as close as possible to the test system. In still a further embodiment as shown in FIG. 7C, a base 22d has connected to its lower surface perpendicular legs 170, 171 connected to adjacent sidewalls of test cabinet 11c. A leveling pad 174 may be provided for the leveling of the base. Instead of being bolted to cabinet 11c, bars 170, 171 may be extended (not shown) and coupled to two additional bars holding the remaining two sides of the cabinet. Thus, the four bars may be bolted to each other to rigidly engage cabinet 11c.

It will also be understood that forearm assembly 34 may be effectively turned 180° while maintaining all the other elements in their original positions. In this manner, rear section 101 extends to the left as compared to the right as shown in FIG. 3.

What is claimed is:

1. A system for maintaining a heavy electronic test head floating in a substantially weightless condition without the effect of gravity to permit without external power manual docking and undocking of the test head with an electronic device handler comprising
 (a) support means including a continuously vertical shaft forming a first vertical axis,
 (b) positioner means pivoted about the continuously vertical shaft and having (1) vertical movement with respect to the vertical shaft and (2) substantial extensible movement in the horizontal plane, the positioner means including pivoting cradle means for attaching the test head,
 (c) counterbalancing means coupled to the positioner means to provide a substantially weightless condition to the positioner means with the test head attached, and
 (d) the positioner means including at least second and third continuously vertical axes parallel with the first vertical axis so that as the positioner means is extended in the horizontal plane, the vertical shaft and the second and third vertical axes themselves support the weight of the positioner means with the test head attached and the vertical shaft and the second and third vertical axes being simultaneously free to rotate as the positioner means is manually rotated about the vertical shaft and the second and third vertical axes without the effect of gravity.

2. The system of claim 1 in which said positioner means includes main arm means having first pivoting means for said main arm means for providing vertical movement along said shaft and rotation about said first vertical axis.

3. The system of claim 2 in which said positioner means includes forearm means having second pivoting means secured to said main arm means for providing rotation of said forearm means about the second continuously vertical axis.

4. The system of claim 3 in which said positioner means includes wrist means having third pivoting means secured to said forearm means for providing rotation of said wrist means about the third continuously vertical axis.

5. The system of claim 1 in which there is provided a test cabinet for the test head and in which there is further provided means for rigidly attaching the support means to the test cabinet.

6. A system for positioning an electronic test head with respect to an electronic device handler comprising
 a housing including a shaft having a first continuously vertical axis,
 positioner means including main arm means having first pivoting means for providing for said main arm means vertical movement along said shaft and rotation about said first vertical axis, forearm means having second pivoting means secured to said main arm means for providing rotation of said forearm means about a second continuously vertical axis, wrist means having third pivoting means secured to said forearm means for providing rotation of said wrist means about a third continuously vertical axis, the first, second and third vertical axes being parallel and continuously vertical,
 cradle means having fourth pivoting means secured to said wrist means for providing rotation of said cradle means about a horizontal axis,
 test head attachment means having fifth pivoting means secured to said cradle means for providing rotation of said attachment means about an additional axis and
 counterbalancing means coupled to the positioner means to provide a substantially weightless condition to the positioner means with the test head attached.

7. The system of claim 6 in which said fifth pivoting means provides rotation of said attachment means about an axis perpendicular to said horizontal axis.

8. The system of claim 7 in which the counterbalance means includes a counterweight substantially equal to the weight of said positioner means and said test head to provide ease of movement of said positioner means.

9. The system of claim 7 in which there is provided a first and second locking means coupled respectively to said first and second pivoting means for preventing movement of said positioner means and said forearm means.

10. The system of claim 9 in which there is provided third, fourth and fifth locking means coupled respectively to said third, fourth and fifth pivoting means for preventing movement of said wrist means, cradle means and attachment means.

11. A system for maintaining a heavy electronic test head floating in a substantially weightless condition without the effect of gravity to permit without external power manual docking and undocking of the test head with an electronic device handler comprising
 (a) support means,
 (b) positioner means coupled to the support means and having (1) vertical movement with respect to the support means and (2) substantial extensible movement in the horizontal plane, the positioner means including means for attaching the test head, (c) counterbalancing means coupled to the positioner means to provide a substantially weightless condition to the positioner means with the test head attached, and
(d) the positioner means and the support means including at least three parallel continuously vertical axes so that as the positioner means is extended in the horizontal plane, the three vertical axes themselves support the weight of the positioner means with the test head attached and the three vertical axes being simultaneously free to rotate as the positioner means is manually rotated about the three vertical axes without the effect of gravity.

* * * * *